United States Patent
Bareiss et al.

(10) Patent No.: US 10,239,142 B2
(45) Date of Patent: *Mar. 26, 2019

(54) MULTI-AIRFOIL SPLIT AND REJOIN METHOD TO PRODUCE ENHANCED DURABILITY COATING

(71) Applicant: UNITED TECHNOLOGIES CORPORATION, Farmington, CT (US)

(72) Inventors: Edward R. Bareiss, Stafford Springs, CT (US); Russell J. Bergman, Windsor, CT (US); Bradley T. Duelm, Wethersfield, CT (US); Michael L. Miller, Euless, TX (US); Paul M. Pellet, Arlington, TX (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 79 days.

This patent is subject to a terminal disclaimer.

(21) Appl. No.: 14/765,467

(22) PCT Filed: Dec. 19, 2013

(86) PCT No.: PCT/US2013/076453
§ 371 (c)(1),
(2) Date: Aug. 3, 2015

(87) PCT Pub. No.: WO2014/143301
PCT Pub. Date: Sep. 18, 2014

(65) Prior Publication Data
US 2015/0352649 A1    Dec. 10, 2015

Related U.S. Application Data

(60) Provisional application No. 61/790,648, filed on Mar. 15, 2013.

(51) Int. Cl.
*B23K 1/00* (2006.01)
*C23C 14/30* (2006.01)
(Continued)

(52) U.S. Cl.
CPC ............ *B23K 1/0018* (2013.01); *B23K 31/02* (2013.01); *B23P 6/007* (2013.01); *C23C 4/02* (2013.01);
(Continued)

(58) Field of Classification Search
CPC . B23K 1/0018; B23K 2201/001; B23K 31/02
(Continued)

(56) References Cited

U.S. PATENT DOCUMENTS

| 5,174,715 A | 12/1992 | Martin |
| 5,248,240 A | 9/1993 | Correia |

(Continued)

FOREIGN PATENT DOCUMENTS

| EP | 1207270 A2 | 5/2002 |
| WO | 20140133804 A1 | 9/2014 |

OTHER PUBLICATIONS

International Search Report for related International Application No. PCT/US13/76453; dated Apr. 11, 2014.
Supplementary European Search Report for EP 13 87 7442.

*Primary Examiner* — Erin B Saad
(74) *Attorney, Agent, or Firm* — Cantor Colburn LLP

(57) ABSTRACT

A method for working an airfoil cluster is disclosed. The method may include attaching a first datum to a first portion of the airfoil cluster and a second datum to a second portion of the airfoil cluster; adding material to at least one of the first portion and the second portion; and joining the first portion to the second portion, the first and second datums substantially aligned in a common plane spaced away from the first and second portions.

9 Claims, 15 Drawing Sheets

(51) Int. Cl.
  *C23C 14/32* (2006.01)
  *B23K 31/02* (2006.01)
  *F01D 5/00* (2006.01)
  *F01D 9/04* (2006.01)
  *C23C 4/02* (2006.01)
  *C23C 4/18* (2006.01)
  *C23C 14/02* (2006.01)
  *C23C 14/58* (2006.01)
  *B23P 6/00* (2006.01)
  *F01D 9/06* (2006.01)
  *B23H 7/02* (2006.01)
  *B23H 9/10* (2006.01)

(52) U.S. Cl.
  CPC ............... *C23C 4/18* (2013.01); *C23C 14/02* (2013.01); *C23C 14/30* (2013.01); *C23C 14/325* (2013.01); *C23C 14/58* (2013.01); *F01D 5/005* (2013.01); *F01D 9/041* (2013.01); *F01D 9/044* (2013.01); *F01D 9/065* (2013.01); *B23H 7/02* (2013.01); *B23H 9/10* (2013.01); *F05D 2230/236* (2013.01); *F05D 2230/64* (2013.01); *F05D 2240/81* (2013.01); *F05D 2300/607* (2013.01); *Y02T 50/676* (2013.01)

(58) Field of Classification Search
  USPC .......................................... 228/159, 160, 182
  See application file for complete search history.

(56) References Cited

U.S. PATENT DOCUMENTS

| | | |
|---|---|---|
| 5,269,057 A | 12/1993 | Mendham |
| 6,131,800 A * | 10/2000 | Fernihough .......... B23K 33/004 228/212 |
| 7,766,618 B1 * | 8/2010 | Liang ..................... F01D 5/186 415/115 |
| 2007/0084052 A1 | 4/2007 | Heinrich et al. |
| 2008/0289179 A1 | 11/2008 | Pellet et al. |
| 2009/0265932 A1 | 10/2009 | Lange |
| 2009/0274562 A1 * | 11/2009 | Minor ..................... F01D 5/288 416/241 R |
| 2010/0239432 A1 * | 9/2010 | Liang ................... F01D 11/001 416/97 R |
| 2012/0047734 A1 | 3/2012 | Miller et al. |
| 2015/0369070 A1 * | 12/2015 | Bareiss .................. B23P 6/005 29/889.21 |

* cited by examiner

MULTI-AIRFOIL SPLIT AND REJOIN METHOD TO PRODUCE ENHANCED DURABILITY COATING

CROSS-REFERENCE TO RELATED APPLICATION

This application is a US National Stage under 35 USC § 371 of International Patent Application No. PCT/US2013/076453 filed on Dec. 19, 2013, and claims priority under 35 USC § 119(e) to U.S. Provisional Patent Application Ser. No. 61/790,648 filed on Mar. 15, 2013.

FIELD OF THE DISCLOSURE

The present disclosure relates generally to gas turbine engines and, more particularly, to a method for working airfoil clusters of a gas turbine engine.

BACKGROUND OF THE DISCLOSURE

Gas turbine engines may typically include a compressor, a combustor, and a turbine, with an annular flow path extending axially through each. Air flows through the compressor where it is compressed or pressurized. The combustor then mixes and ignites the compressed air with fuel, generating hot combustion gases. These hot combustion gases are then directed from the combustor to the turbine where power is extracted from the hot gases by causing blades of the turbine to rotate.

The compressor and turbine sections of the engine include airfoil arrays, such as multiple alternating stages of rotor blades and stator vanes. These airfoil arrays may include features, such as endwall contouring, cored serpentine passages, cross-platform serpentine passages, and the like, to mitigate endwall losses, cool the platforms from which the airfoils extend, and better enhance the overall performance of the engine. In addition, durability coatings may be applied to the airfoil arrays to prevent accelerated material deterioration.

In order to reduce costs, airfoil arrays are cast in clusters having two or more airfoils. However, applying durability coatings to airfoil clusters after casting may be difficult. This invention is directed to providing a reliable method for facilitating the application of durability coatings to airfoil clusters, while taking into consideration features, such as endwall contouring and serpentine passages.

SUMMARY OF THE DISCLOSURE

According to one exemplary embodiment of the present disclosure, a method for working an airfoil cluster is disclosed. The method may comprise attaching a first datum to a first portion of the airfoil cluster and a second datum to a second portion of the airfoil cluster; adding material to at least one of the first portion and the second portion; and joining the first portion to the second portion, the first and second datums substantially aligned in a common plane spaced away from the first and second portions.

In a refinement, the method may further comprise attaching more than one first datum to the first portion and more than one second datum to the second portion.

In another refinement, the method may further comprise adding a braze material to the first portion and to the second portion, and applying a coating to the first portion and to the second portion.

In another refinement, the method may further comprise using at least one of a plasma spray process, air plasma spray process, low pressure plasma spray process, electron beam physical vapor deposition process, and cathodic arc deposition process to apply a coating to at least one of the first portion and the second portion.

In another refinement, the method may further comprise providing the airfoil cluster in as a stator vane cluster composed of a single-crystal material and positioned in a turbine section of a gas turbine engine.

In another refinement, the method may further comprise attaching the first datum to a forward surface of the first portion and the second datum to a forward surface of the second portion.

In another refinement, the method may further comprise machining a surface of each of the first and second datums relative to predetermined datum of the airfoil cluster.

In another refinement, the method may further comprise aligning the surfaces of the first and second register blocks in the common plane in order to align the first and second portions, a contoured endwall and cross-platform cooling passages of the first and second portions being aligned in a configuration substantially identical to a configuration of the airfoil cluster prior to undergoing work.

In yet another refinement, the method may further comprise removing the first and second datums.

According to another exemplary embodiment of the present disclosure, a method for working an airfoil cluster is disclosed. The method may comprise attaching a first register block to a first portion of the airfoil cluster and second register block to a second portion of the airfoil cluster; separating the first portion from the second portion; adding material to at least one of the first portion and the second portion; and joining the first portion and the second portion, the first and second register blocks having a predefined arrangement with respect to one another which aligns the first and second portions.

In another refinement, an outer surface of the first register block and an outer surface of the second register block may have a predefined contour arrangement with respect to one another.

In another refinement, the method may further comprise aligning the first portion with the second portion by setting the outer surfaces of the first and second register blocks on a surface that matches the predefined contour arrangement, an endwall contouring and cross-platform cooling passages of the first and second portion being aligned through the use of the first and second register blocks.

In another refinement, the method may further comprise using a cutting process to separate the first portion from the second portion such that multi-directional passages of the airfoil cluster are preserved.

In yet another refinement, the method may further comprise reconstructing the first and second portions to account for at least part of a material lost due to the cutting process.

According to yet another exemplary embodiment of the present disclosure, a method for working an airfoil cluster of a gas turbine engine is disclosed. The method may comprise providing the airfoil cluster with a first portion and a second portion, each of the first and second portions having a passage; attaching a first register block to the first portion of the airfoil cluster; attaching a second register block to the second portion of the airfoil cluster; splitting the airfoil cluster between the first portion and the second portion such that the passages of the first and second portions are preserved; adding material to at least one of the first and second portions; aligning the first portion with the second portion through surfaces of the first and second register blocks; joining the first and second portions together; and removing the first and second register blocks.

In a refinement, the method may further comprise cutting the airfoil cluster between the passage of the first portion and the passage of the second portion.

In another refinement, the method may further comprise adding an equal amount of preformed braze material to each of the first and second portions, and applying a durability coating to each of the first and second portions.

In another refinement, the method may further comprise attaching two first register blocks to the first portion of the airfoil and two second register blocks to the second portion of the airfoil.

In another refinement, the method may further comprise providing an attachment hole and a separate locating hole in each of the first and second register blocks for attaching and locating the first and second portions to a fixture during a cutting process, and using the attachment hole in the first register block for attachment of the first portion to a fixture during a joining process.

In yet another refinement, the method may further comprise aligning the surfaces of the first and second register blocks in a plane not within a space of the first and second portions, the alignment of the surfaces of the first and second register blocks aligning a contoured endwall and cross-platform cooling passages of the first and second portions in a configuration substantially identical to a configuration of the airfoil cluster prior to undergoing work.

These and other aspects and features of the disclosure will become more readily apparent upon reading the following detailed description when taken in conjunction with the accompanying drawings. Although various features are disclosed in relation to specific exemplary embodiments of the invention, it is understood that the various features may be combined with each other, or used alone, with any of the various exemplary embodiments of the invention without departing from the scope of the invention.

BRIEF DESCRIPTION OF THE DRAWINGS

FIG. 5 is a perspective view of the airfoil cluster of FIG. 3 with register blocks welded on;

While the present disclosure is susceptible to various modifications and alternative constructions, certain illustrative embodiments thereof, will be shown and described below in detail. It should be understood, however, that there is no intention to be limited to the specific embodiments disclosed, but on the contrary, the intention is to cover all modifications, alternative constructions, and equivalents falling within the spirit and scope of the present disclosure.

DETAILED DESCRIPTION

Figure 1:
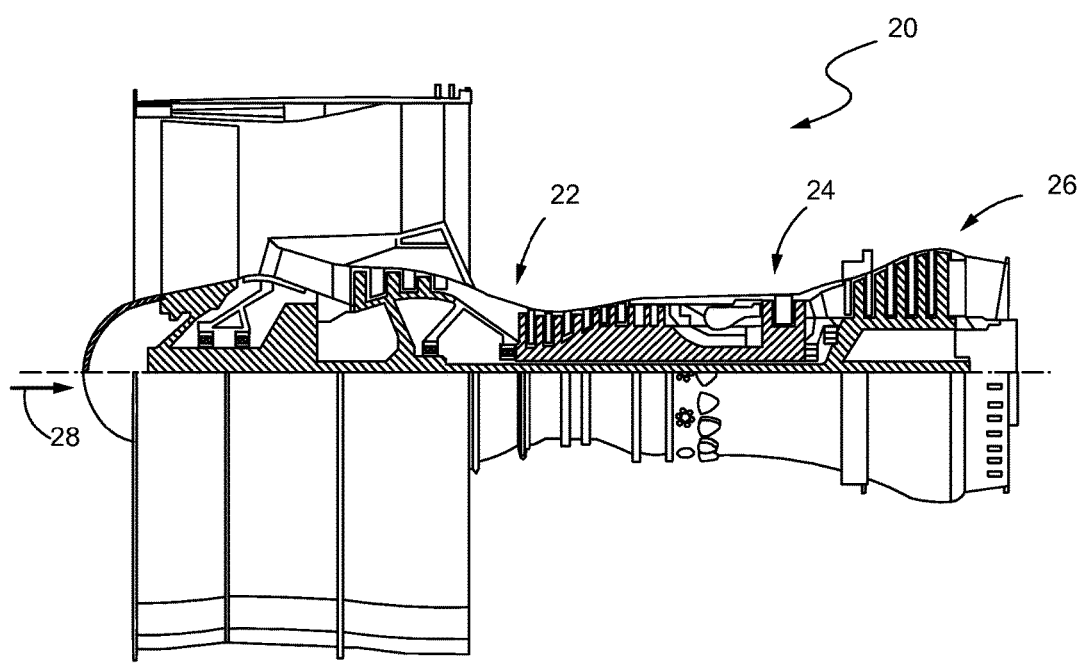
FIG. 1 is a cross-sectional view of a gas turbine engine.

Referring now to the drawings, and with specific reference to FIG. 1, in accordance with the teachings of the disclosure, an exemplary gas turbine engine 20 is shown. The gas turbine engine 20 may generally comprise a compressor section 22 where air is pressurized, a combustor 24 downstream of the compressor section which mixes and ignites the compressed air with fuel and thereby generates hot combustion gases, a turbine section 26 downstream of the combustor 24 for extracting power from the hot combustion gases, and an annular flow path 28 extending axially through each. The gas turbine engine 20 may be used on an aircraft for generating thrust or power, or in land-based operations for generating power as well.

Figure 2:
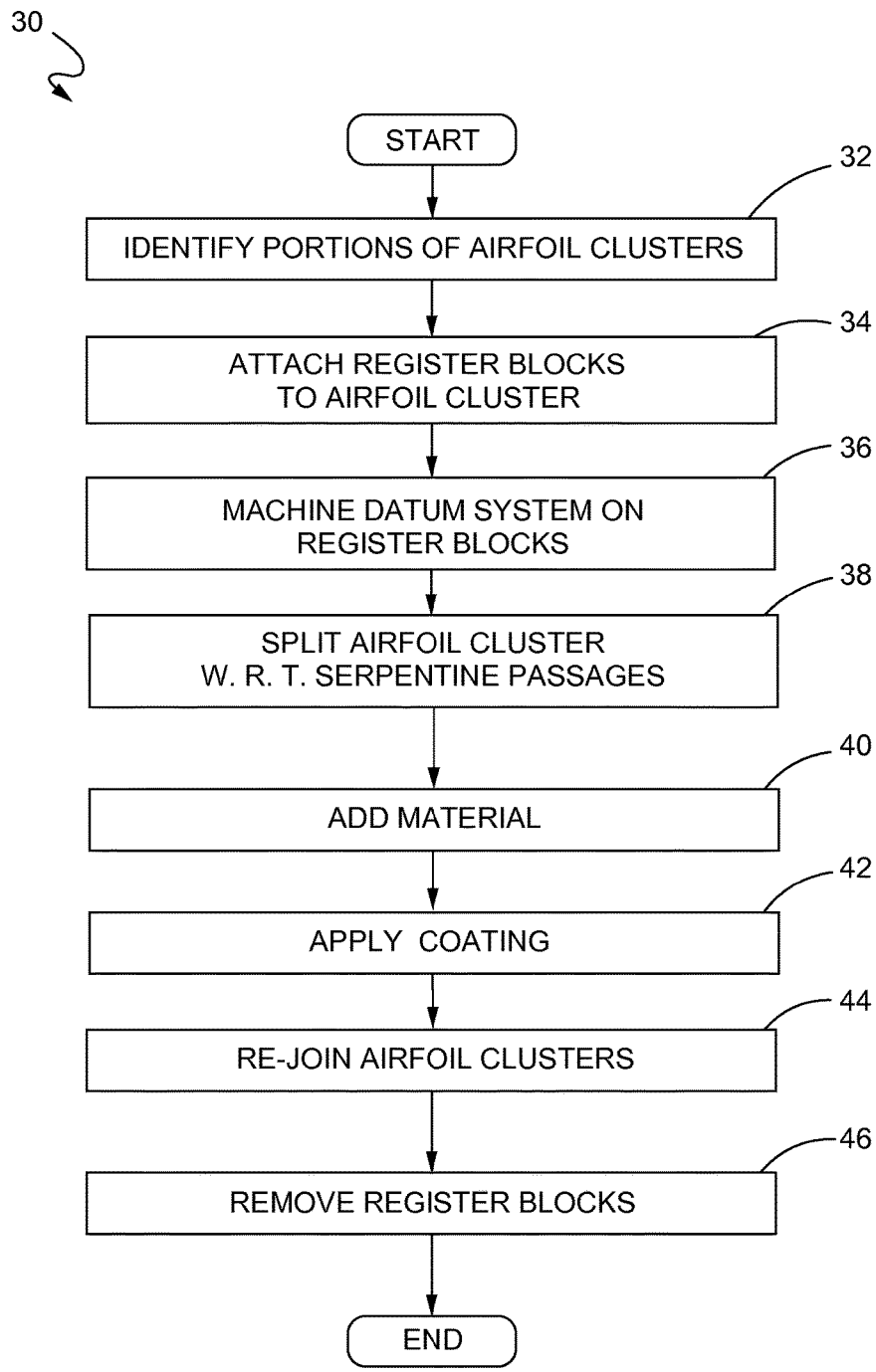
FIG. 2 is an exemplary flowchart outlining a method for working an airfoil cluster of the gas turbine engine of FIG. 1, according to an embodiment of the present disclosure.

Turning now to FIG. 2, an exemplary flowchart outlining a method 30 for working an airfoil cluster of the gas turbine engine 20 is shown. The method 30 may be applied to any airfoil cluster in a stage of rotor blades or stator vanes in the compressor section 22 or the turbine section 26 of the gas turbine engine 20. For example, the method 30 may be applied to an airfoil cluster 50, such as a stator vane cluster, shown in FIG. 3.

Airfoil cluster 50 may be composed of a single-crystal material, such as a single-crystal nickel super alloy, which is a rhenium-free single-crystal. Other suitable materials are certainly possible. The airfoil cluster 50 may include a first airfoil 52 and a second airfoil 54. Although not shown, it is to be understood that the cluster 50 may comprise more than two airfoils. Each of the airfoils 52, 54 extends axially (fore to aft) from a leading edge 56 to a trailing edge 58 and extends radially from an inner platform 60 to an outer platform 62.

The airfoil cluster 50 may also include various features to enhance engine performance. For example, an endwall 64 of the outer platform 62 and/or inner platform 60 may be contoured in order to mitigate endwall losses. Furthermore, as shown best in FIG. 4, the outer platform 62 (or inner platform 60) may also include various passages, such as passages 66, 68, 70 in order to provide cooling to the platforms 60, 62 and airfoils 52, 54. Passages 66 may be "cross-platform" extending laterally across and generally defined by a surface 65 of the platform 62, and may include trip strips 67 to create turbulence as air flows through the passages 66. In addition, passages 66 may be serpentine or multi-directional, extending in more than one direction across the surface 65 of the platform 62.

Figure 3:
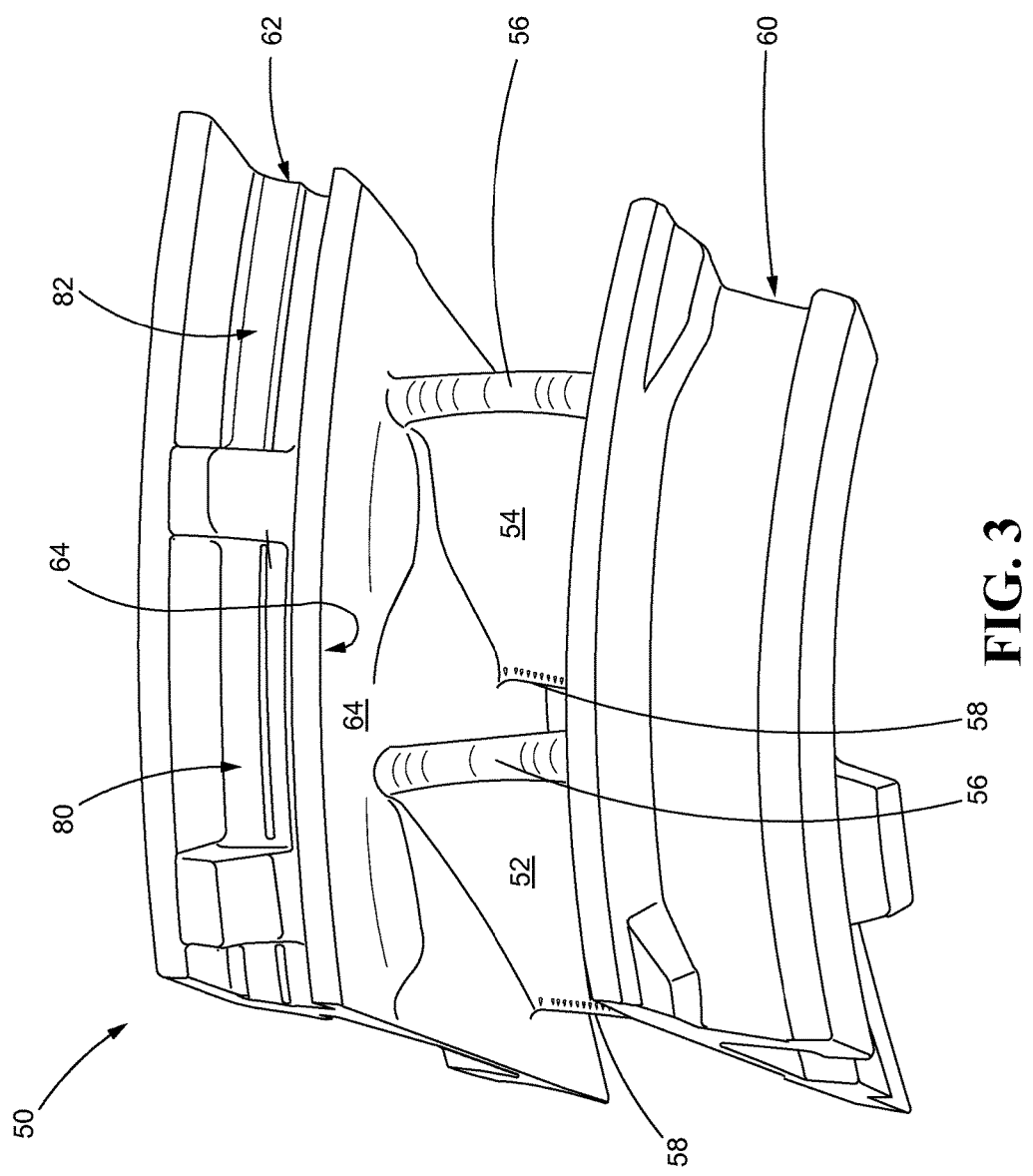
FIG. 3 is a perspective view of an airfoil cluster of the gas turbine engine of FIG. 1.
Figure 4:
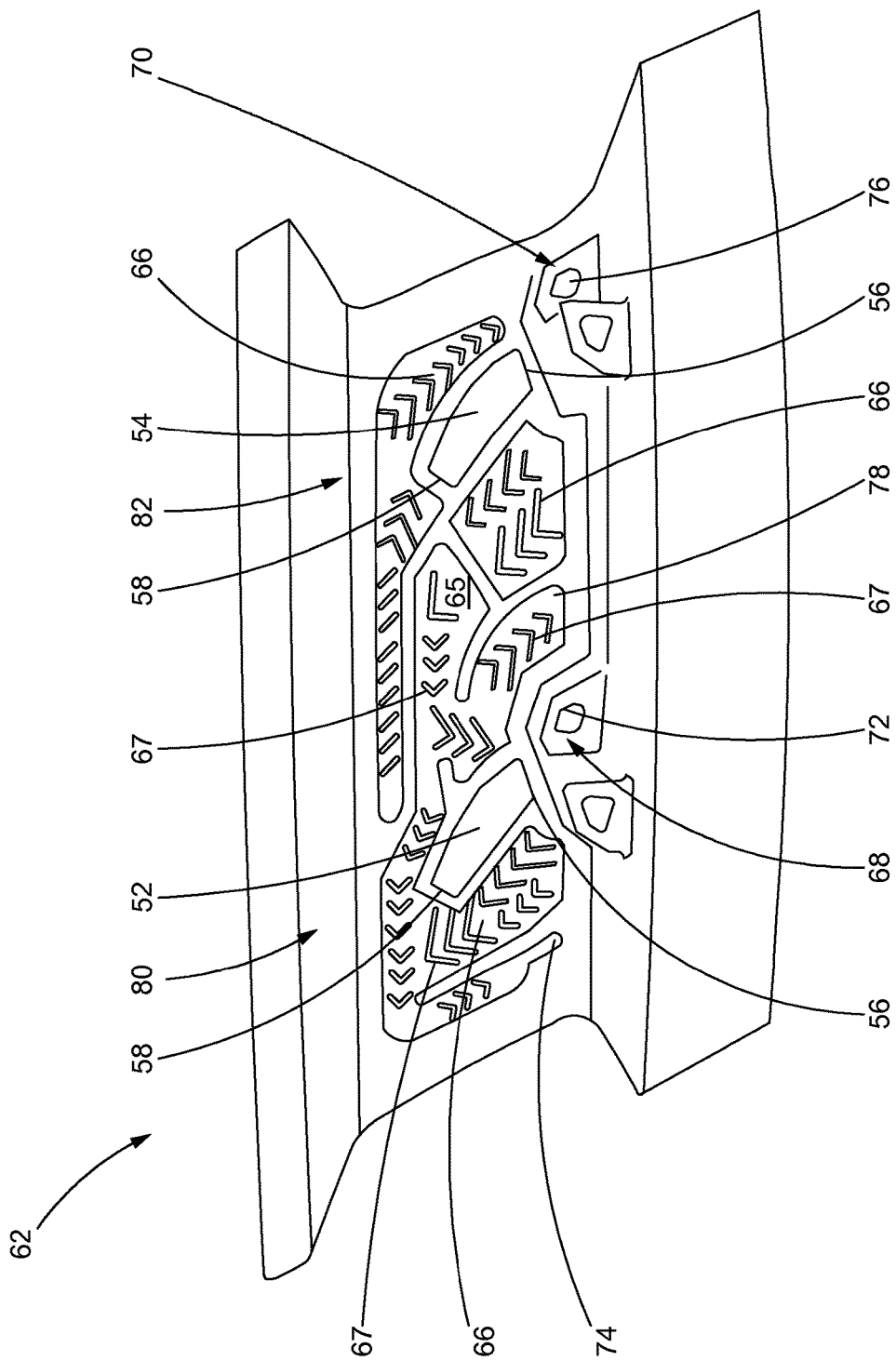
FIG. 4 is a top view of an outer platform of the airfoil cluster of FIG. 3.

Passages 68, 70 may be "cored" or extend internally within the platform, and may also be serpentine or multi-directional, extending in more than one direction within the platform. For example, a first passage 68 may extend internally within the outer platform 62 from an inlet 72 to an outlet 74. From the inlet 72 to the outlet 74, first passage 68 may traverse in different directions (such as axially, radially, and/or circumferentially with respect to engine axis X in FIG. 1) within the platform 62, at least in part wrapping around the leading edge 56 of the first airfoil 52. Similarly, a second passage 70 may extend internally within the outer platform 62 from an inlet 76 to an outlet 78. From the inlet 76 to the outlet 78, second passage 70 may traverse in different directions (such as axially, radially, and/or circumferentially with respect to engine axis X in FIG. 1) within the platform 62, at least in part wrapping around the leading edge 56 of the first airfoil 54. It is to be understood that the endwall 64 contouring and passages 66, 68, 70 shown in FIGS. 3 and 4 are merely exemplary, and that other various features, arrangements, and configurations of the airfoil cluster 50 may certainly benefit from the method disclosed herein.

A coating, such as a durability coating to prevent accelerated material deterioration, may be applied to the airfoil cluster 50. However, there may be limited access to surfaces between the first and second airfoils 52, 54. In order to apply the coating to the surfaces between the first and second airfoils 52, 54, the airfoil cluster 50 may be split into portions and later rejoined. At identify portions of airfoil clusters 32 in the method 30 in FIG. 2, portions of the airfoil cluster 50 to be worked may be identified. For example, a first portion 80 may include the first airfoil 52 and first passage 68, and a second portion 82 may include the second airfoil 54 and second passage 70, as shown in FIGS. 3 and 4.

Figure 5:
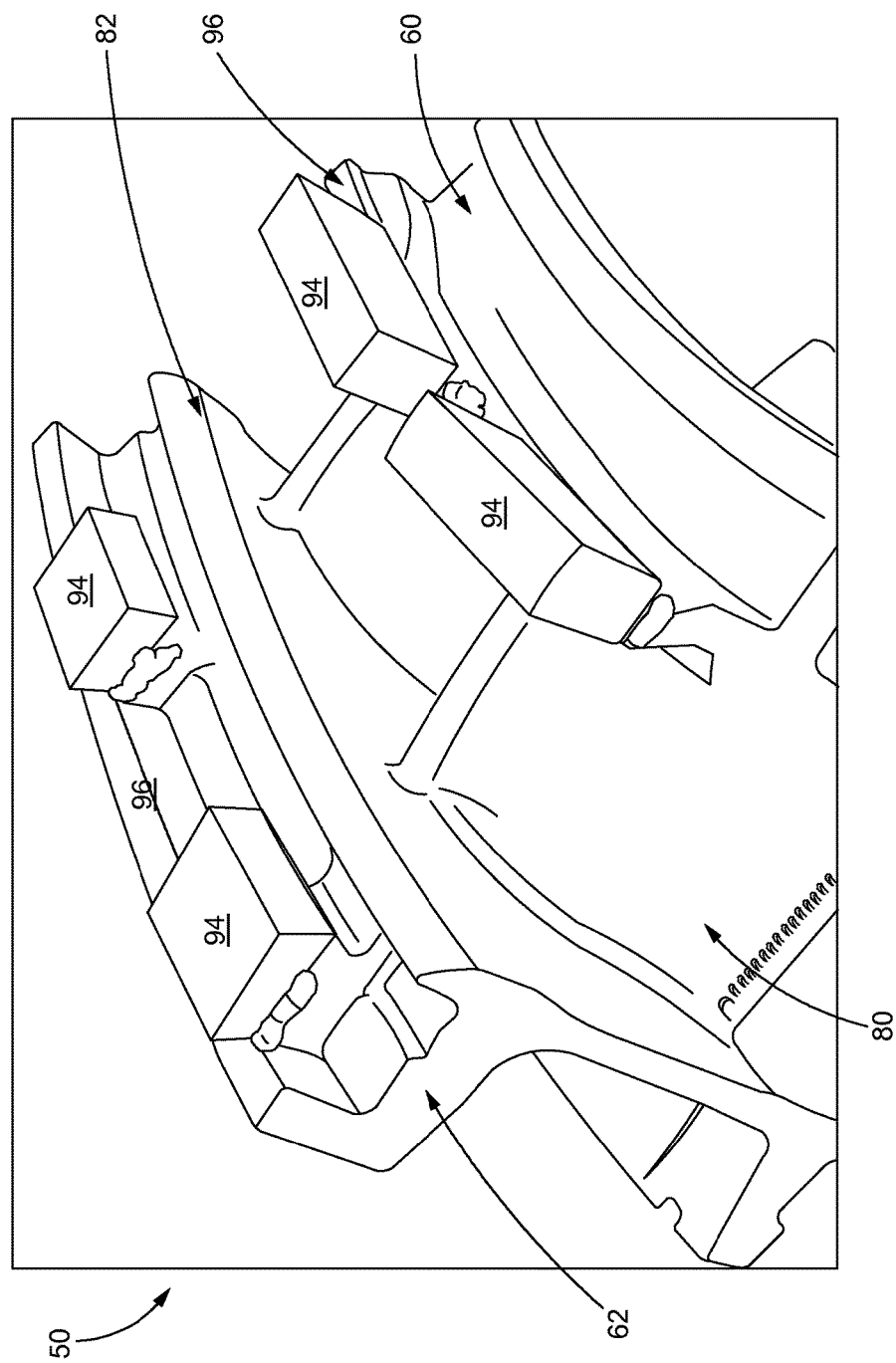

Next, at attach register blocks to airfoil cluster 34 in the method 30 (FIG. 2), datums or register blocks 94 are attached to the airfoil cluster 50, as shown best in FIG. 5. At least one datum or register block 94 may be attached to the first portion 80 of the airfoil cluster 50, and at least one datum or register block 94 may be attached to the second portion 82 of the airfoil cluster 50. The datums or register blocks 94 may be formed out of a metal, such as steel, in a rectangular shape, although other suitable materials and shapes are possible. Register blocks 94 may be mounted to a forward surface 96 of the inner and outer platforms 60, 62 via welding or other techniques. The forward surface 96 may be taken in reference to an engine axis X (FIG. 1) running fore to aft through the engine 20. For example, forward surface 96, is a foremost surface of the airfoil cluster when positioned within the engine 20. It is certainly possible to mount the register blocks 94 to other surfaces or parts of the airfoil cluster 50 as well.

Figure 6:
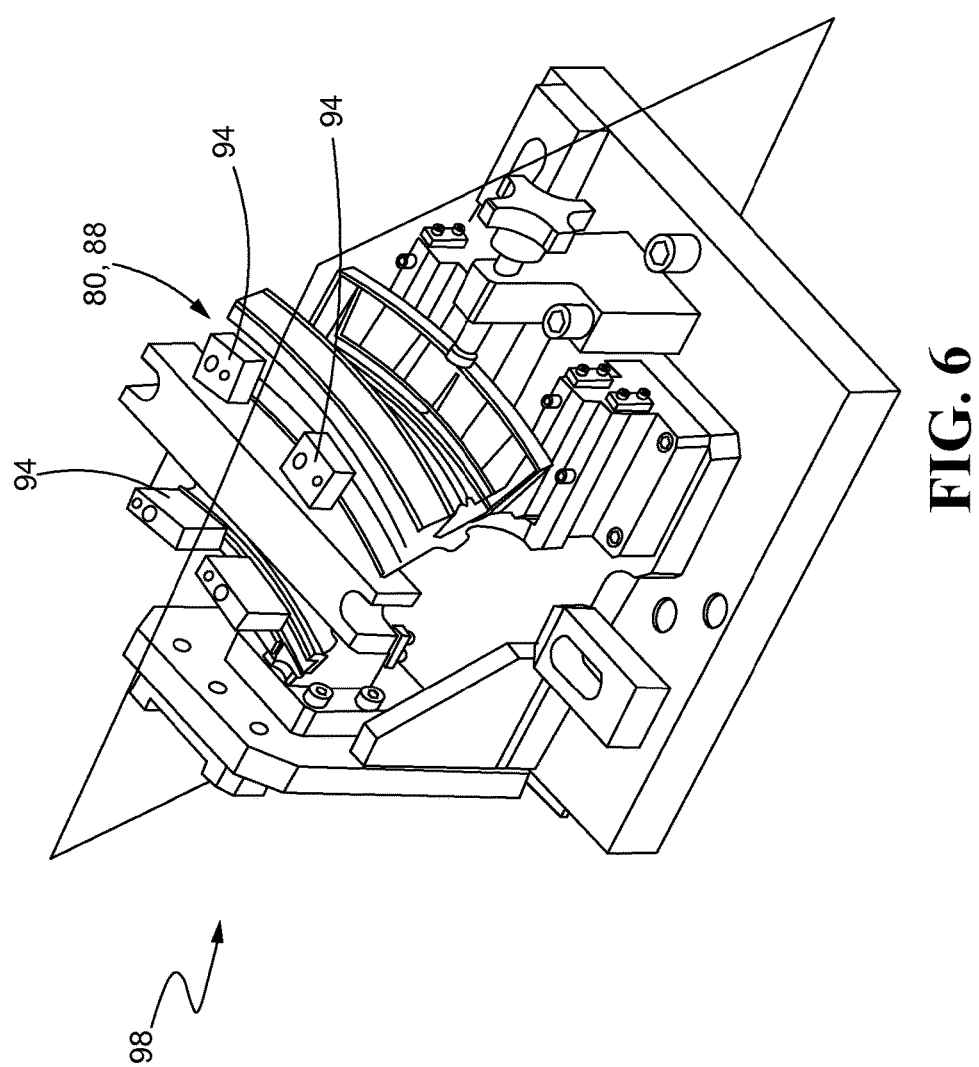
FIG. 6 is a perspective view of the airfoil cluster of FIG. 5 within a milling fixture.

At machine datum system on register blocks 36 in the method 30 (FIG. 2), a datum system is machined or registered on the register blocks 94. For example, the airfoil cluster 50 may be placed within a milling fixture 98, as shown best in FIG. 6. The milling fixture 98 may machine the datum system on the register blocks 94, relative to predetermined datum of the airfoil cluster 50. In so doing, new datum surfaces are created on the airfoil cluster 50. Furthermore, the register blocks on any airfoil cluster may be machined consistently from one airfoil cluster to the next, based on the predetermined datum of the airfoil cluster, thereby creating the same new datum surfaces on every airfoil cluster.

Figure 7:
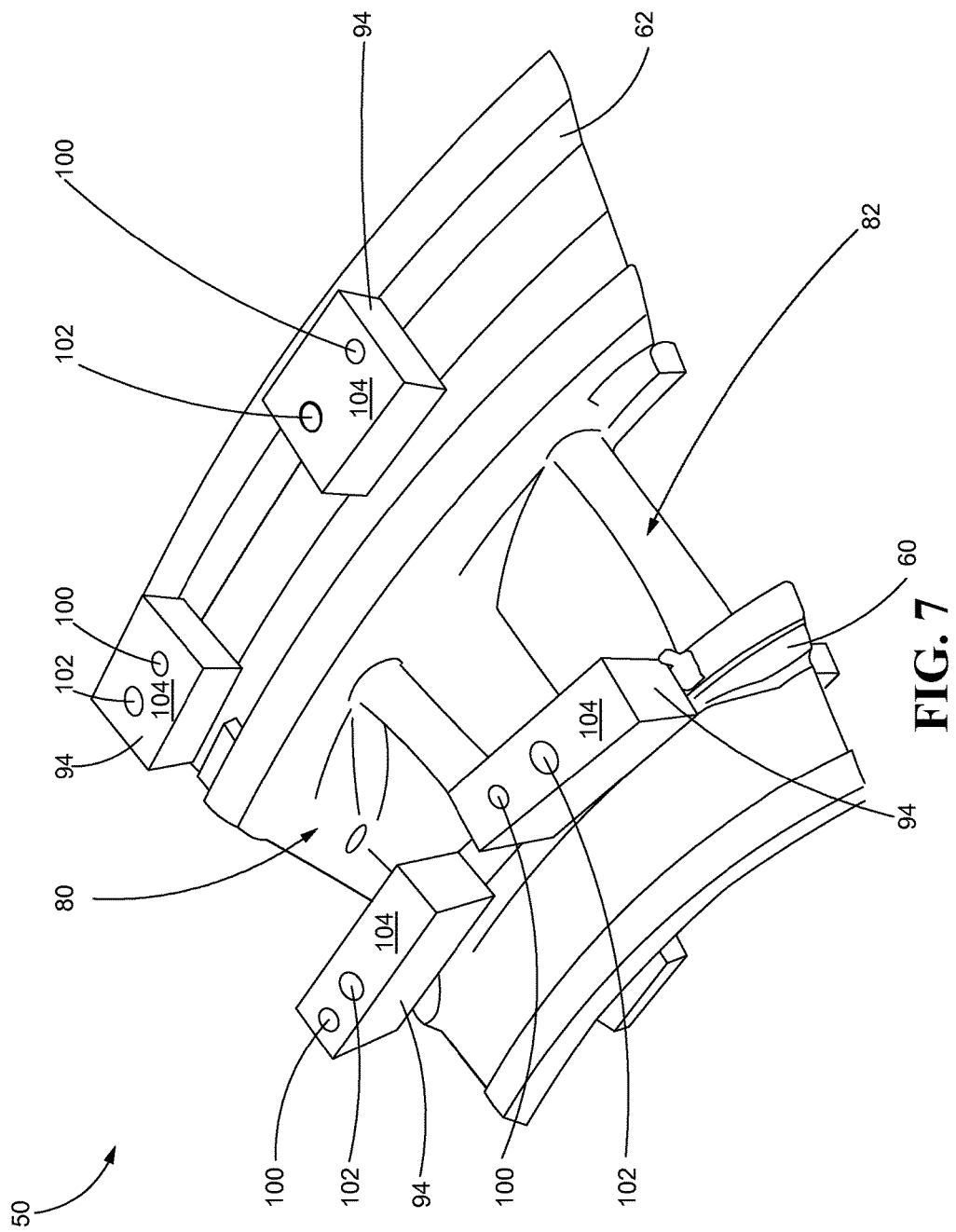
FIG. 7 is a perspective view of the airfoil cluster of FIG. 5 after machining the register blocks using the milling fixture of FIG. 6.
Figure 8:
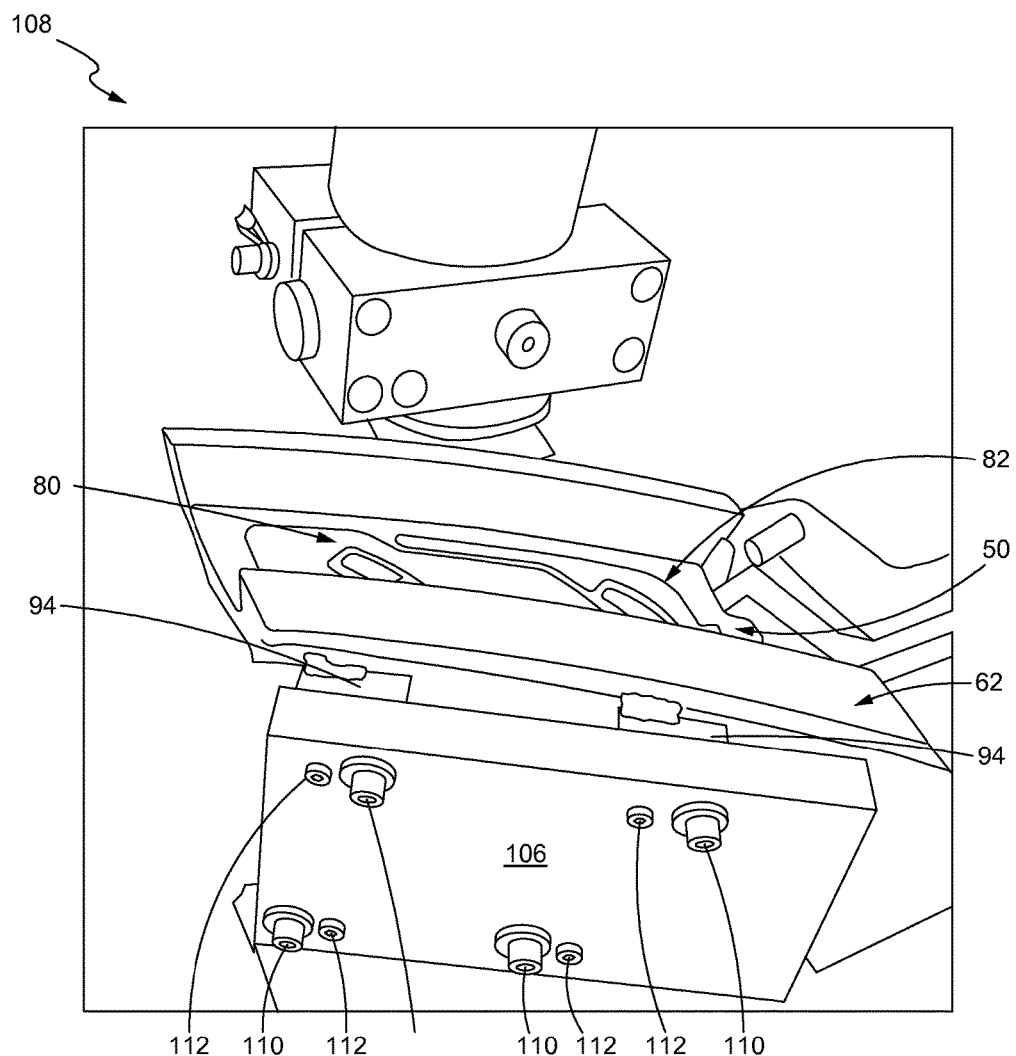
FIG. 8 is a perspective view of the airfoil cluster of FIG. 7 within a wire electrical discharge machining fixture.

For example, as shown best in FIG. 7, the datum system may include an attachment hole 100 and a locating hole 102 provided in each of the register blocks 94 by the milling fixture 98. A configuration and arrangement of the attachment holes 100 and locating holes 102 in each of the register blocks 94 may be machined relative to predetermined datum of the airfoil cluster, as well as fixtures used in latter steps of the method. The attachment hole 100 may be threaded to allow direct attachment of the register block 94 to a fixture via a bolt or other suitable means. The locating hole 102 may facilitate location or positioning of the register block 94 to a fixture via a pin or other suitable means. Machining the holes 100, 102 in the register blocks 94 allows for attachment and location of the airfoil cluster 50 to a fixture without having to drill holes in the airfoil cluster itself, thereby preserving a structure and integrity of the airfoil cluster.

In addition, the datum system may include a face or outer surface 104 of each of the register blocks 94 machined relative to predetermined datum of the airfoil cluster. The outer surfaces 104 may have a predefined contour arrangement with respect to one another. For example, the outer surfaces 104 may be machined such that each outer surface 104 of the register blocks 94 is aligned in a same or common predetermined plane not within a space of the first and second portions 80, 82 of the airfoil cluster 50, such as a plane substantially parallel to and away from the forward surface 96 of the airfoil cluster. The register blocks 94 may be machined to a same height. By machining the outer surface 104 of every register block 94 to the same predetermined face or surface such that the outer surface 104 of every register block 94 shares a common plane spaced away from the airfoil cluster 50, a standard of precise alignment for the first and second portions 80, 82 may be established in an axial position. It is to be understood that other positions of alignment using the register blocks on the airfoil clusters are certainly possible.

Next, at split airfoil cluster with respect to serpentine passages 38 in the method 30 (FIG. 2), the airfoil cluster 50 is split with respect to the first and second passages 68, 70. The airfoil cluster 50 may be split into separate first and second portions 80, 82 via a wire electrical discharge machining (wire EDM) process, as shown in FIGS. 8-11, although other techniques for removal, such as grinding, are certainly possible. The airfoil cluster 50 may be positioned and attached to a plate 106 of a wire EDM fixture 108 using pins 110 and bolts 112 through the attachment and locating holes 100, 102, respectively, of the register blocks 94.

Figure 9:
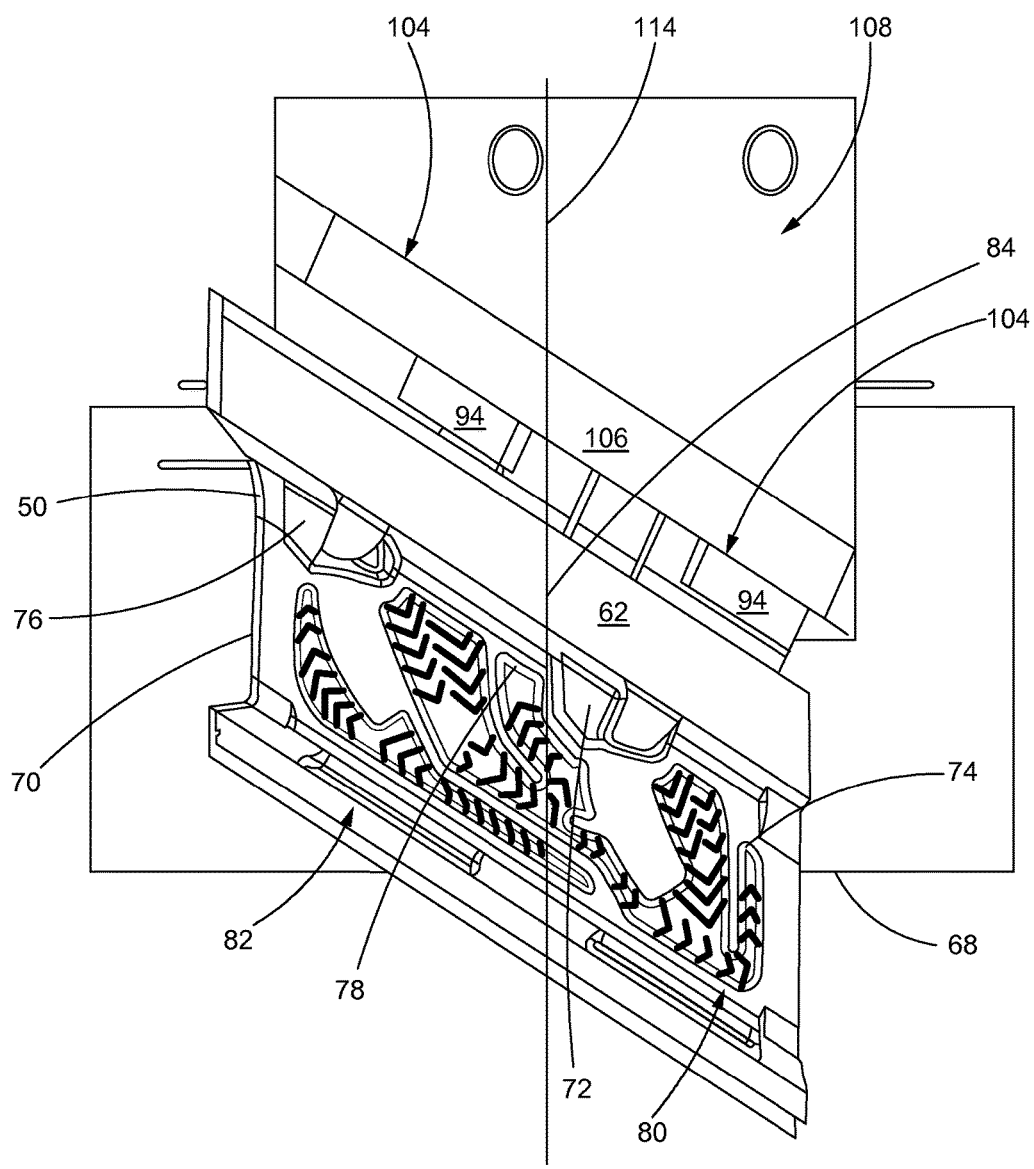
FIG. 9 is a top view of the airfoil cluster within the wire electrical discharge machining fixture of FIG. 8.
Figure 10:
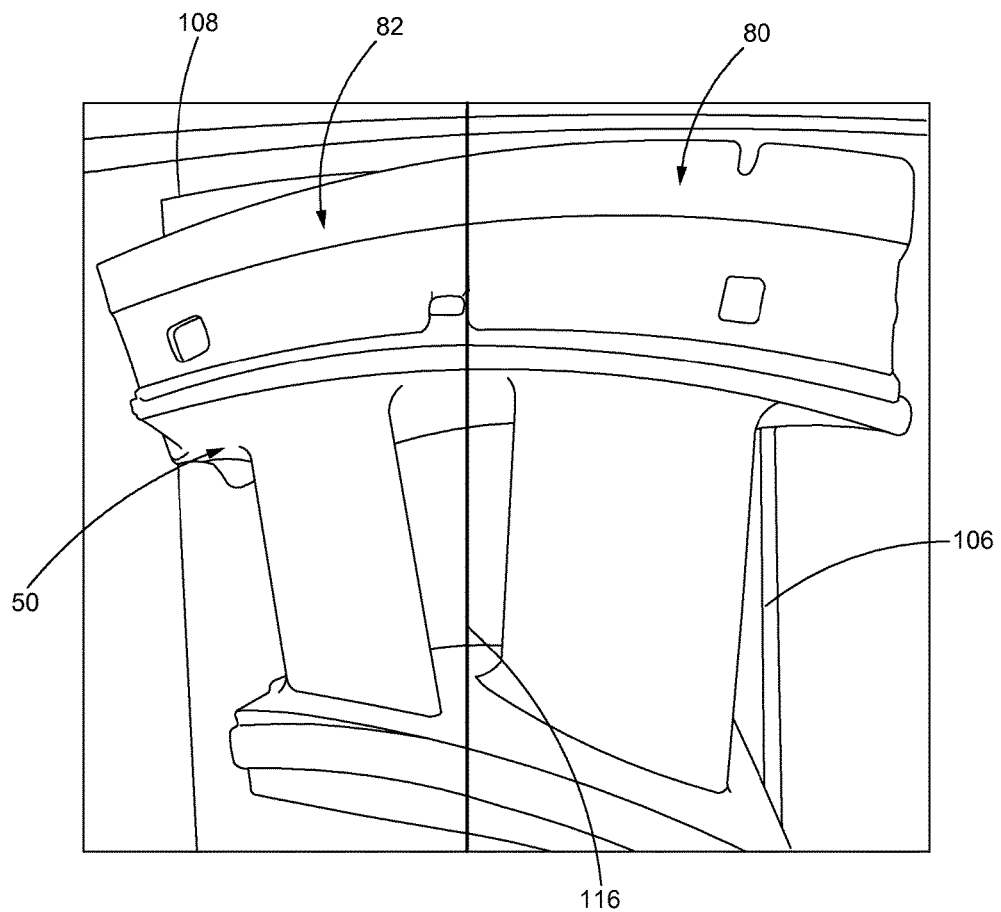
FIG. 10 is an enlarged side view of the airfoil cluster within the wire electrical discharge machining fixture of FIG. 8.
Figure 11:
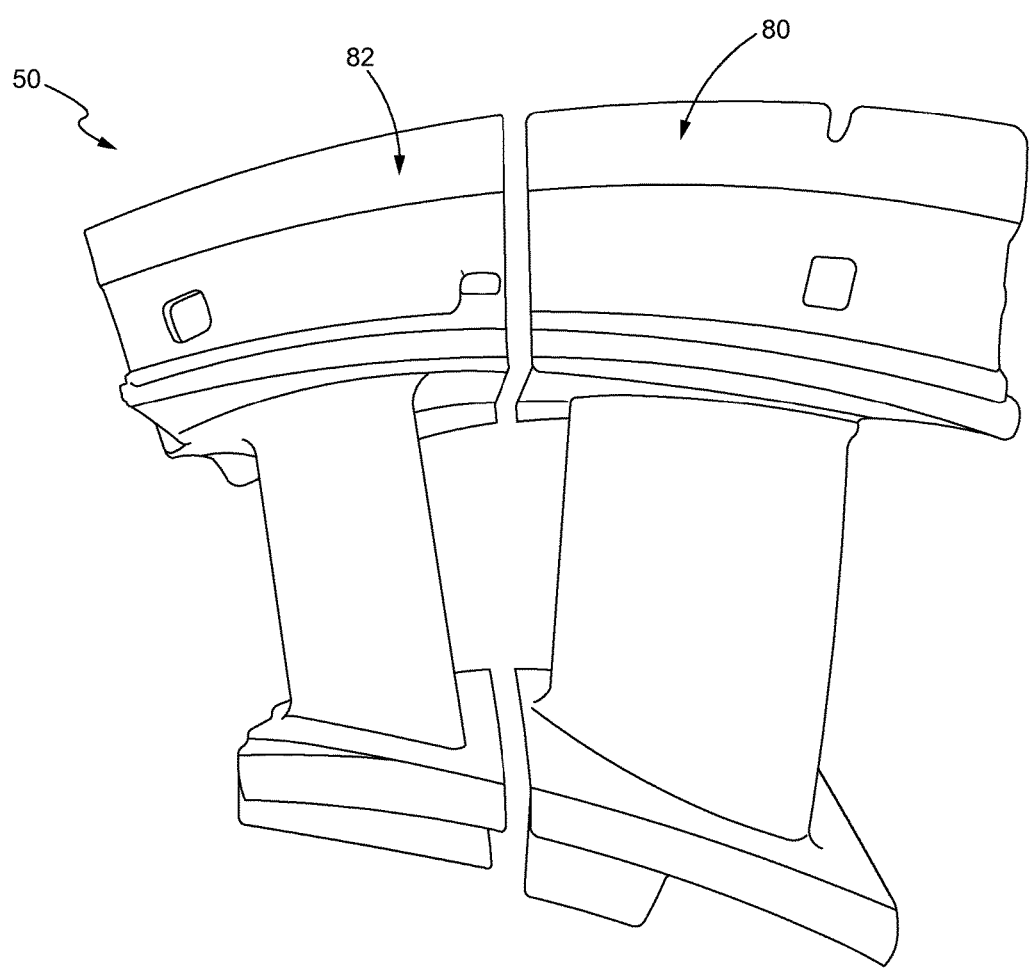
FIG. 11 is a side view of the airfoil cluster of FIG. 8 after being cut by the wire electrical discharge machining fixture.

A wire 116 of the wire EDM fixture 108 cuts through a cut plane 114 on the airfoil cluster 50 to separate first and second portions 80, 82. A location of the cut plane 114 for the wire 116 of the EDM fixture 108 may be determined based on a location of the passages 68, 70. For example, the cut plane 114 may be determined such that it does not pass through any part of the first passage 68 of the first portion 80 or the second passage 70 of the second portion 82. As shown in FIG. 9, the cut plane 114 may be located between the first passage 68 and the second passage 70, such as at or near a rib 84 located between the inlet 72 of the first passage 68 and the outlet 78 of the second passage 70. By cutting between the inlet 72 of the first passage 68 and the outlet 78 of the second passage 70, both passages may be preserved and kept intact. After the airfoil cluster 50 is split into two, first and second portions 80, 82 may be cleaned. It is to be understood that the location of cut plane 114 in FIG. 9 is merely exemplary and that other locations for the cut plane 114 may be determined based on the locations of the passages 68, 70.

At add material 40 in the method 30 (FIG. 2), material may be added to at least one of the first and second portions 80, 82. The first and/or second portions 80, 82 may be reconstructed to account for at least part of a width of the cut plane 114 or kerf (material cut off on either side of the wire 116 due to the wire EDM process). For example, an equal amount of preformed braze material may be added to the first portion 80 and the second portion 82, such as to surfaces of first and second portions 80, 82 that faced cut plane 114 during the wire EDM process. The braze material on portions 80, 82 may then be brazed and subsequently grinded to reconstruct those surfaces. It is to be understood that other processes, such as welding, plasma and coating, may also be used to add material to first and second portions 80, 82. Furthermore, unequal amounts of material may be added to the first and second portions 80, 82, or material may only be added to either the first portion or the second portion, without departing from the spirit of the disclosure.

Next, at apply coating 42 in the method 30 (FIG. 2), the durability coating or coatings may be applied to the separated first and second portions 80, 82. Coating processes may include, but not be limited to, a plasma spray process, air plasma spray process, low pressure plasma spray process, electron beam physical vapor deposition process, and cathodic arc deposition process. It is to be understood that processes, other than coating, that may be difficult to perform to the airfoils 50, 52 while clustered (such as inspection) may also be completed at this step when the airfoils are separated.

At re-join airfoil clusters 44 in the method 30 (FIG. 2), the airfoil cluster 50 may be re-joined. For example, the first and second portions 80, 82 may be joined via diffusion brazing. Other welding, brazing, or joining techniques may be used as well. The portions 80, 82 may be cleaned prior to brazing. In addition, the first portion 80 and second portion 82 may be tack welded together for a temporary attachment of the two portions before the brazing process.

Figure 12:
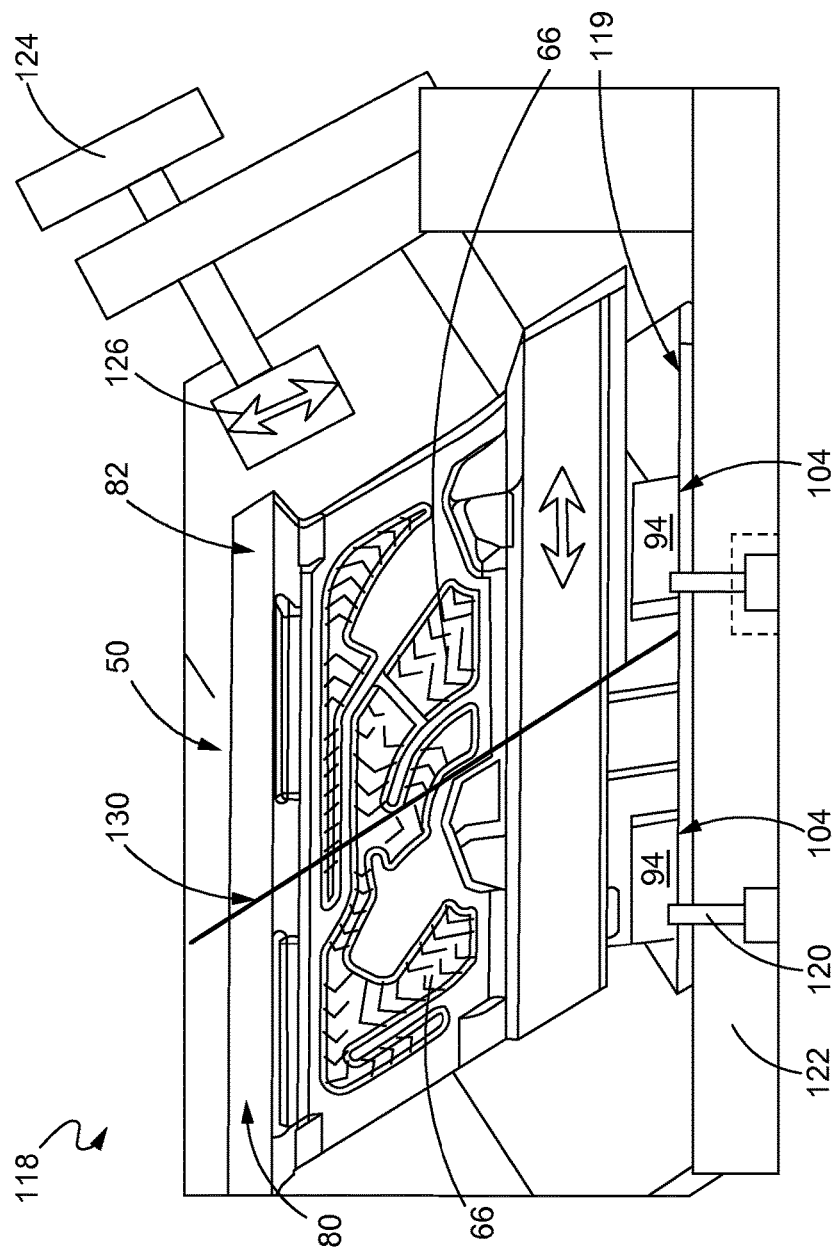
FIG. 12 is a top view of two portions of the airfoil cluster of FIG. 11 aligned within a brazing assembly fixture after adding material to the two portions.

As shown best in FIG. 12, the first and second portions 80, 82 may be aligned on a brazing assembly fixture 118 using the register blocks 94. As described in step 36 above, the outer surfaces 104 of all the register blocks 94 of the first and second portions 80, 82 have a predefined contour arrangement such that they are machined to a common plane, relative to predetermined datum of the airfoil cluster 50. Therefore, when the first and second portions 80, 82 are resting on the outer surfaces 104 of register blocks 94, and the outer surfaces 104 are set on a surface 119 that matches the predefined contour arrangement, the two portions 80, 82 are automatically aligned in the axial direction. In so doing, the contouring of the endwall 64 and the passages 66 are precisely aligned between the first and second portions 80, 82 in a configuration substantially identical to a configuration of the airfoil cluster 50 prior to undergoing work.

The first portion 80 may be attached to the brazing assembly fixture 118 via bolts 120 threaded through a plate 122 of the brazing assembly fixture 118 to the attachment holes 100 of the register blocks 94. Thus, the register blocks 94 also provide for attachment and alignment of the airfoil cluster 50 to the brazing assembly fixture 118. The second portion 82 may be slidably engaged with the plate 122 of the brazing assembly fixture 118 such that a pusher arm 124 of the brazing assembly fixture 118 may push the fourth portion 92 against the first portion 80. Positioned square to the second portion 82, a push bar 126 on the pusher arm 124 of the brazing assembly fixture 118 may evenly apply pressure across the inner and outer platforms 60, 62 of the second portion 82 to form a small braze gap between a bond joint 130 of the first and second portions 80, 82.

Figure 13:
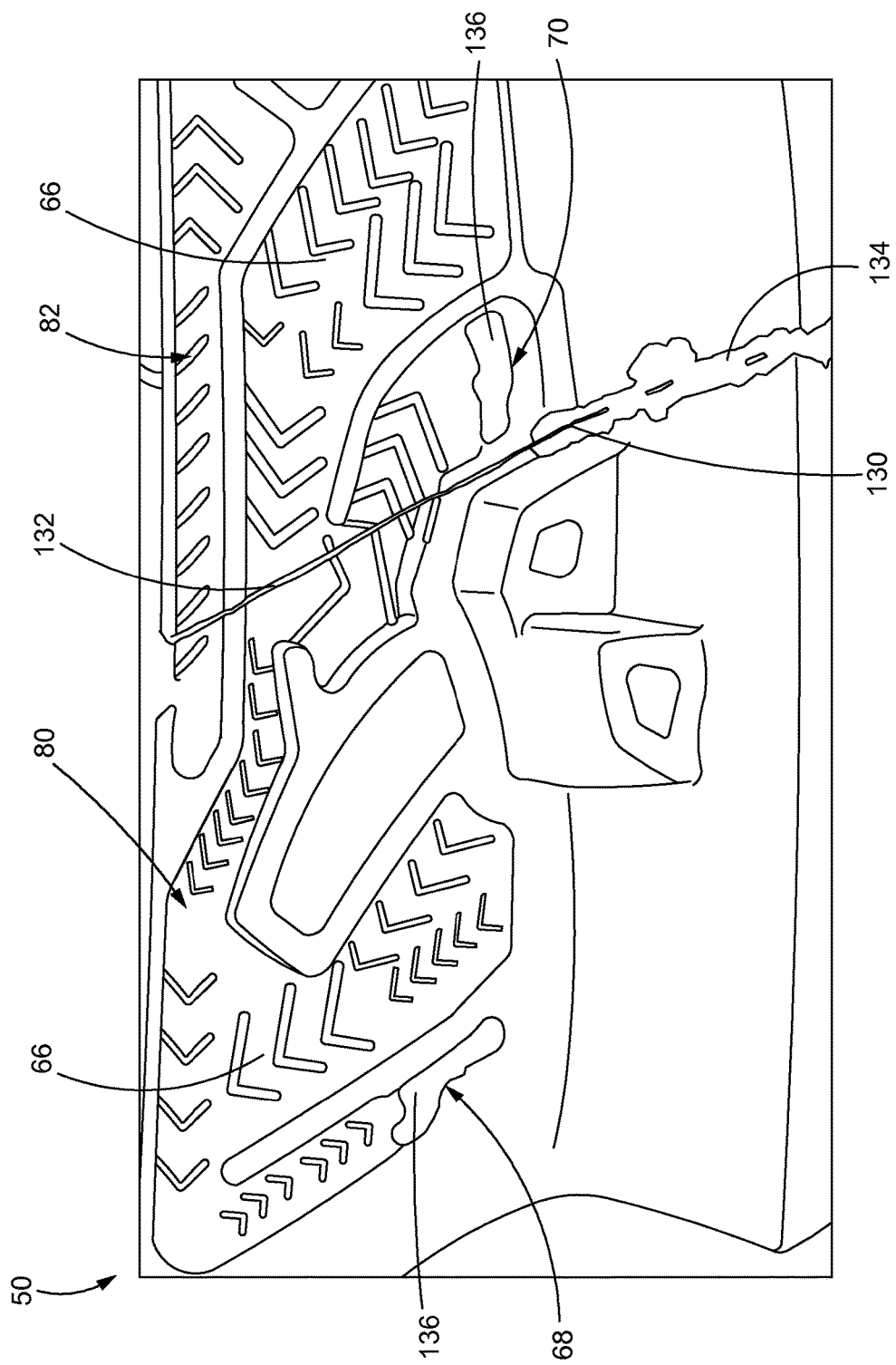
FIG. 13 is an enlarged view of the two portions of FIG. 12 prepared for brazing.

Braze foil 132 is then placed within the bond joint 130, as shown best in FIG. 13. Braze slurry 134 may be also added to form a porosity-free bond joint. For example, blaze slurry 134 may be applied to a surface of the bond joint 130 around the passages 66 and contoured endwalls 64 to ensure unimpeded flow across the passages 66 and endwalls 64. Stop-off 136 may be applied to the passages 68, 70 to prevent the flow of braze foil 132 and braze slurry 134 within the passages 68, 70 during brazing. The assembled first and second portions 80, 82 are then heated in a furnace, where the braze foil 132 and braze slurry 134 melt, joining the two portions 80, 82 together to re-join the airfoil cluster 50. By adding preformed braze material to the two separated portions 80, 82 in step 44 and adding braze foil 132 when joining the two portions 80, 82, airfoil cluster 50 is substantially identical to a configuration of the airfoil cluster 50 prior to undergoing work.

Figure 14:
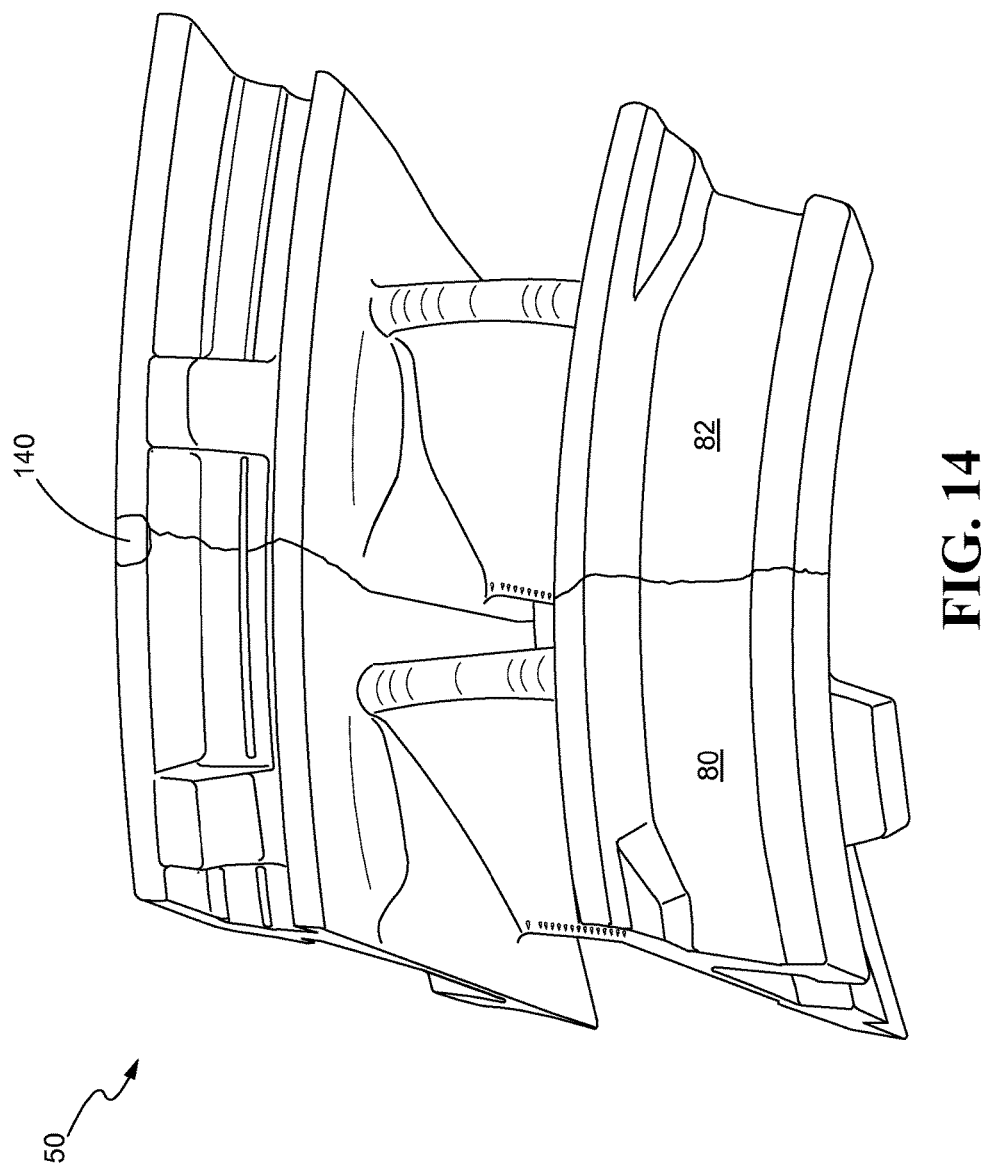
FIG. 14 is a perspective view of the two portions of FIG. 13 joined together by brazing.
Figure 15:
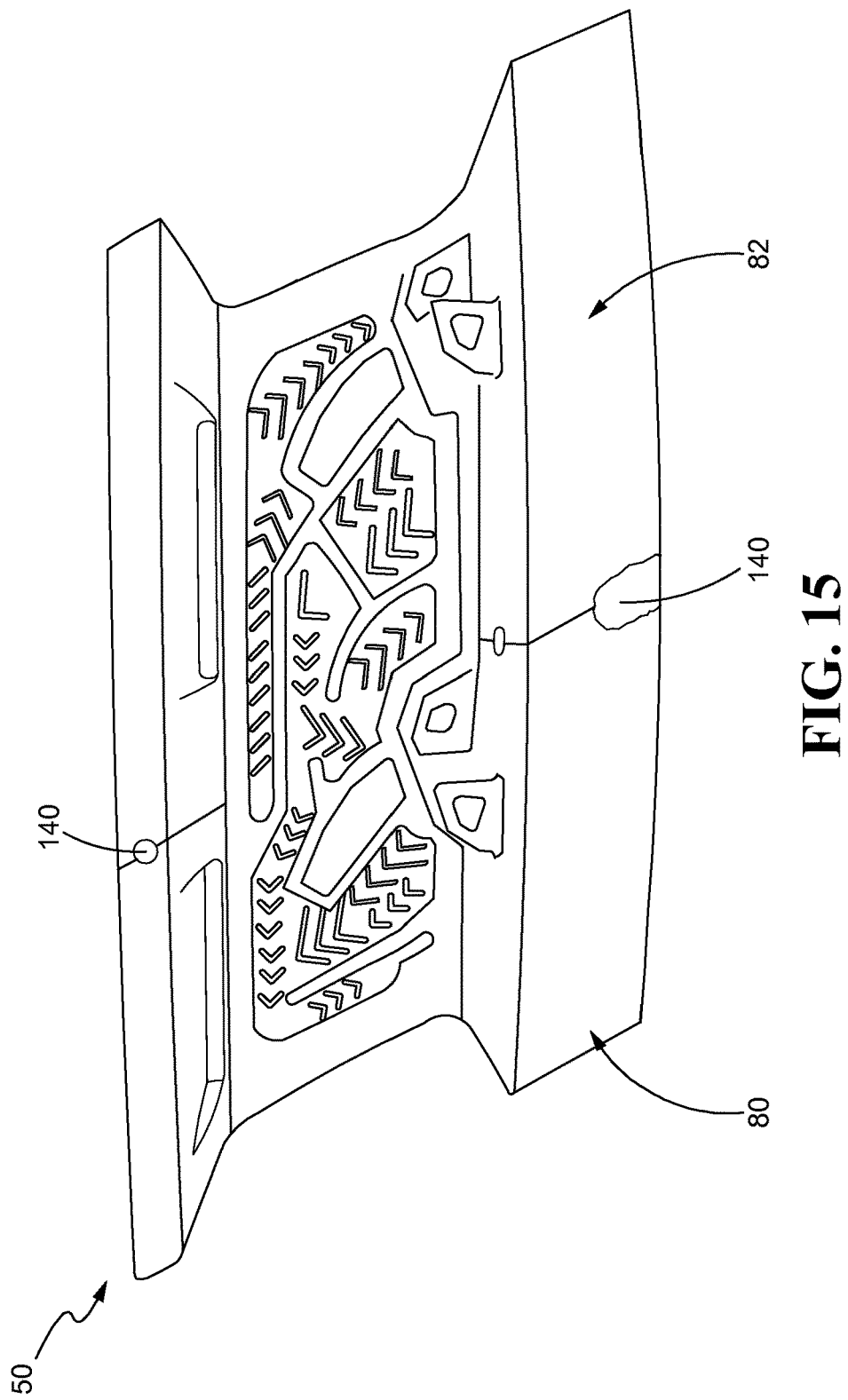
FIG. 15 is a top view of the re-joined airfoil cluster of FIG. 14.

Lastly, at remove register blocks 46 in the method 30 (FIG. 2), the register blocks 94 may be removed from the worked airfoil cluster 50, as shown best in FIGS. 14 and 15. For example, the register blocks 94 may be removed via grinding. Other finishing processes may be performed on airfoil cluster 50 as well. For example, the stop-off 136 may be flushed out of the passages 68, 70, excess material such as tack welds 140 may be blended, airfoil cluster 50 may be grit-blasted, and inspection completed. The worked airfoil cluster 50 may then proceed through subsequent manufacturing processes to introduce the airfoil cluster 50 into a new engine or to return it into a used engine.

Although shown and described as splitting and re-joining the same portions 80, 82 of airfoil cluster 50, method 30 may also apply to airfoil clusters or airfoil singlets (structures having a single airfoil) that do not need to be split. For example, the method 30 may be applied to a portion split from one airfoil cluster and a new or supplemental airfoil portion, cluster or singlet. Alternatively, the method 30 may be used to join two new airfoil singlets. In addition, it is to be understood that the method disclosed herein may be applied to other parts of the gas turbine engine as well, aside from airfoils, without departing from the spirit of the disclosure.

INDUSTRIAL APPLICABILITY

From the foregoing, it can be seen that the teachings of this disclosure can find industrial application in any number of different situations, including but not limited to, gas turbine engines. Such engines may be used, for example, on aircraft for generating thrust, or in land, marine, or aircraft applications for generating power.

The present disclosure provides a method for working airfoil clusters of a gas turbine engine. More specifically, the disclosed method facilitates the application of durability coatings to new or used airfoil clusters through a novel split and rejoin process. Furthermore, the disclosed method can be applied to airfoil clusters composed of a single-crystal, rhenium-free alloy and airfoil clusters having endwall contouring and various serpentine passages, features for which repair methods have not previously accommodated.

By attaching register blocks to a forward surface of the airfoil cluster such that outer surfaces of the register blocks align in a common plane spaced away from the airfoil cluster, a standard for precise alignment of portions of the airfoil cluster is provided. The register blocks can then ensure precise alignment of the airfoil cluster portions after splitting and during re-join. Precisely aligning the airfoil cluster portions during re-join ensures the unimpeded airflow across the contoured endwalls and cross-platform serpentine passages, thereby supporting the intended performance goals of the engine. Moreover, the register blocks also provide for attachment and alignment of the airfoil cluster portions to the various fixtures used in the method, without compromising the integrity and structure of the airfoil cluster portions themselves.

In addition, the disclosed method can be applied to a mass production of newly casted airfoil clusters. By splitting the airfoil clusters at the same rib or location from one airfoil cluster to the next and adding the same amount of material to each portion, the portions may be interchangeable. Furthermore, any two matching portions, whether or not they both originated from the same airfoil cluster, will consistently align due to the machining of the attached register blocks relative to predetermined datum of the airfoil cluster. In all cases, the worked airfoil cluster is substantially identical to a configuration of the airfoil cluster prior to undergoing work.

While the foregoing detailed description has been given and provided with respect to certain specific embodiments, it is to be understood that the scope of the disclosure should not be limited to such embodiments, but that the same are provided simply for enablement and best mode purposes. The breadth and spirit of the present disclosure is broader than the embodiments specifically disclosed, but rather includes all embodiments and equivalents encompassed within the claims appended hereto as well.

What is claimed is:

1. A method for working an airfoil cluster, comprising:
   attaching a first register block to a first portion of the airfoil cluster and a second register block to a second portion of the airfoil cluster wherein the first portion and the second portion each comprise a contoured end wall and a serpentine, cross-platform cooling passage having at least one trip strip;
   using a cutting process to separate the first portion from the second portion such that the serpentine passage of the airfoil cluster is preserved;
   separating the first portion from the second;
   adding material to at least one of the first separated portion and the second separated portion;
   applying a coating to the first separated portion and the second separated portion; and
   joining the first portion and the second portion, the first and second register blocks having a predefined arrangement with respect to one another which aligns the first and second separated portions, wherein an outer surface of the first register block and an outer surface of the second register block has a predefined contour arrangement with respect to one another, and further comprising aligning the first separated portion with the second separated portion by setting the outer surfaces of the first and second register blocks on a surface that matches the predefined contour arrangement, an endwall contouring and cross-platform cooling passages of the first and second separated portions being aligned through the use of the first and second register blocks.

2. The method of claim 1, further comprising attaching more than one first register block to the first portion and more than one second register block to the second portion.

3. The method of claim 1, further comprising using at least one of a plasma spray process, air plasma spray process, low pressure plasma spray process, electron beam physical vapor deposition process, and cathodic arc deposition process to apply the coating.

4. The method of claim 1, further comprising providing the airfoil cluster as a stator vane cluster composed of a single-crystal material and positioned in a turbine section of a gas turbine engine.

5. The method of claim 1, further comprising reconstructing the first and second separated portions to account for at least part of a material lost due to the cutting process.

6. A method for working an airfoil cluster of a gas turbine engine, the method comprising:
   providing the airfoil cluster with a first portion and a second portion, each of the first and second portions having a serpentine, cross-platform cooling passage having at least one trip strip;
   attaching a first register block to the first portion of the airfoil cluster;
   attaching a second register block to the second portion of the airfoil cluster;
   providing an attachment hole and a separate locating hole in each of the first and second register blocks for attaching and locating the first and second portions to a fixture during a cutting process;
   splitting and separating the airfoil cluster between the first portion and the second portion such that the passages of the first and second portions are preserved;
   adding an equal amount of material to at each of the first and second separated portions;
   applying a durability coating to each of the first and second separated portions; aligning the first separated portion with the second separated portion through surfaces of the first and second register blocks; joining the first and second separated portions together;
   using the attachment hole in the first register block for attachment of the first separated portion to a fixture during the joining process; and removing the first and second register blocks.

7. The method of claim 6, further comprising cutting the airfoil cluster between the passage of the first portion and the passage of the second portion.

8. The method of claim 6, further comprising attaching two first register blocks to the first portion of the airfoil and two second register blocks to the second portion of the airfoil.

9. The method of claim 6, further comprising aligning the surfaces of the first and second register blocks in a plane not within a space of the first and second portions, the alignment of the surfaces of the first and second register blocks aligning a contoured endwall and cross-platform cooling passages of the first and second separated portions in a configuration substantially identical to a configuration of the airfoil cluster prior to undergoing work.

* * * * *